United States Patent
Chang et al.

(10) Patent No.: US 10,107,847 B2
(45) Date of Patent: Oct. 23, 2018

(54) DIAGNOSTIC METHOD FOR CONTACTOR RESISTANCE FAILURE

(71) Applicant: Ford Global Technologies, LLC, Dearborn, MI (US)

(72) Inventors: Xiaoguang Chang, Northville, MI (US); Chuan He, Northville, MI (US); Xu Wang, Dearborn, MI (US); Richard Dyche Anderson, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 848 days.

(21) Appl. No.: 14/224,809

(22) Filed: Mar. 25, 2014

(65) Prior Publication Data

US 2015/0276842 A1    Oct. 1, 2015

(51) Int. Cl.
  *G01R 31/00* (2006.01)
  *G01R 31/04* (2006.01)
  *G01R 31/36* (2006.01)
  *G01R 27/20* (2006.01)

(52) U.S. Cl.
  CPC ......... *G01R 31/005* (2013.01); *G01R 27/205* (2013.01); *G01R 31/04* (2013.01); *G01R 31/3644* (2013.01); *G01R 31/007* (2013.01)

(58) Field of Classification Search
  CPC ... B60L 3/0046; G01R 27/205; G01R 31/005; G01R 31/007
  See application file for complete search history.

(56) References Cited

U.S. PATENT DOCUMENTS

| | | | | |
|---|---|---|---|---|
| 5,402,302 A | * | 3/1995 | Boucheron | H01H 47/325 361/152 |
| 5,666,040 A | * | 9/1997 | Bourbeau | H01M 2/348 320/118 |
| 2011/0049977 A1 | * | 3/2011 | Onnerud | B60L 3/0046 307/9.1 |
| 2013/0038341 A1 | * | 2/2013 | Flack | G01R 27/205 324/713 |
| 2013/0307480 A1 | * | 11/2013 | Boggs | B60L 3/00 320/118 |
| 2014/0028088 A1 | * | 1/2014 | Salziger | B60R 16/02 307/9.1 |
| 2014/0028322 A1 | * | 1/2014 | Tzivanopoulos | G01R 31/3606 324/433 |
| 2014/0152318 A1 | * | 6/2014 | Bertrand | G01R 31/362 324/434 |

(Continued)

FOREIGN PATENT DOCUMENTS

| JP | H11299013 A | 10/1999 |
|---|---|---|
| JP | 2013105557 A | 5/2013 |

(Continued)

*Primary Examiner* — Son Le
*Assistant Examiner* — Adam Clarke
(74) *Attorney, Agent, or Firm* — David Kelley, Esq.; Tung & Associates

(57) ABSTRACT

A diagnostic method for contact resistance failure includes estimating electrical contact surface resistance of at least one contactor, determining a faulted status of the at least one contactor and indicating the faulted status of the at least one contactor if the at least one contactor is in the faulted status.

16 Claims, 2 Drawing Sheets

(56) References Cited

U.S. PATENT DOCUMENTS

2015/0061376 A1* 3/2015 Hartl ..................... B60R 16/02
  307/9.1
2015/0168497 A1* 6/2015 Tabatowski-Bush ......................
  G01R 31/362
  324/426

FOREIGN PATENT DOCUMENTS

KR     20040013305 A    2/2004
KR     20130051228      5/2013

* cited by examiner

DIAGNOSTIC METHOD FOR CONTACTOR RESISTANCE FAILURE

FIELD

Illustrative embodiments of the disclosure generally relate to contactors for battery packs in electrified vehicles. More particularly, illustrative embodiments of the disclosure relate to a method for diagnosing a resistance failure mode of contactors on a battery pack.

BACKGROUND

In an electrified vehicle, a contactor connects the battery pack to high-voltage electrical loads such as a traction motor. When the electrical contact surface of a contactor is clean and smooth, the contactor consumes nearly no power. However, the contact surface can be damaged or rendered unclean due to vehicle vibration, hazard gases, electric shock duration and other influences. The damaged or unclean surface may lead to increasing contact surface resistance.

The increase in surface resistance of a contactor may cause the contactor to consume a substantial portion of power, reducing the usable power which is available from the battery pack to drive the traction motor and/or charge the battery pack. The resistance, in turn, increases heat dissipation which may heat the contactor and further damage the contractor and battery pack. Because of the large battery current used in an electrified vehicle, the electrical power which is consumed by the contactor may be considerable even though the contact surface resistance may be very small. For example, if the contact surface resistance is as small as 0.1 ohm, the battery current may be as large as 200 Amp and the contactor may consume 4 KW electrical power.

The increasing surface resistance on the contactor may result in a failure mode in the electrified vehicle. Therefore, it may be desirable to define a diagnostic strategy to detect a failure mode which results from a compromised contact surface on a contactor in a battery pack.

Accordingly, a method for diagnosing a resistance failure mode of contactors on a battery pack may be desirable for some applications.

SUMMARY

Illustrative embodiments of the disclosure are generally directed to a diagnostic method for contact resistance failure. An illustrative embodiment of the method includes estimating electrical contact surface resistance of at least one contactor, determining a faulted status of the at least one contactor and indicating the faulted status of the at least one contactor if the at least one contactor is in the faulted status.

BRIEF DESCRIPTION OF THE DRAWINGS

Illustrative embodiments of the disclosure will now be described, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable users skilled in the art to practice the disclosure and are not intended to limit the scope of the claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Figure 1:
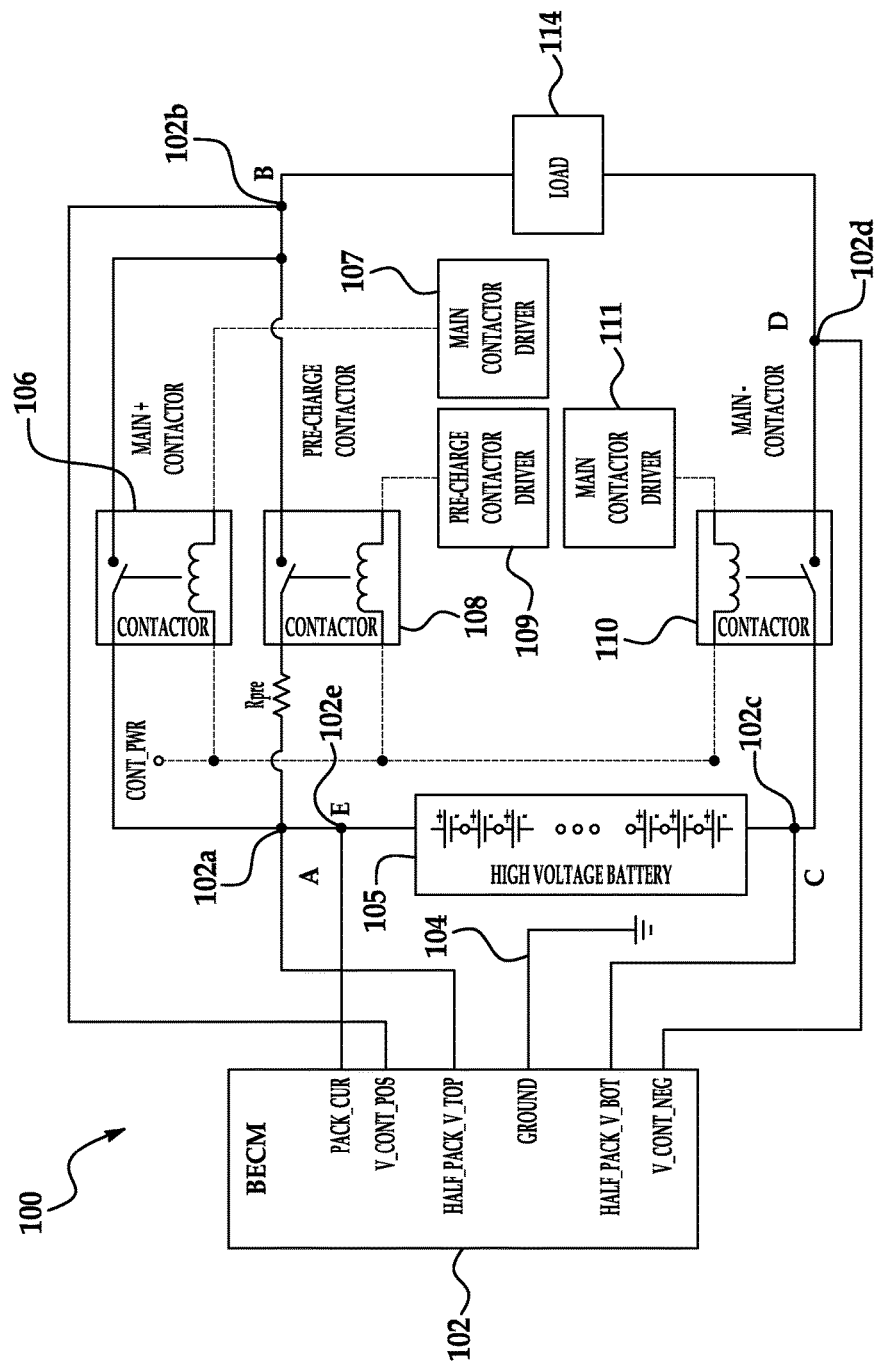
FIG. 1 is a functional block diagram of an exemplary electrified vehicle electrical system in implementation of an illustrative embodiment of a diagnostic method for contact resistance failure.

Referring initially to FIG. 1, a functional block diagram of an exemplary electrified vehicle electrical system, hereinafter system, in implementation of an illustrative embodiment of a diagnostic method for contact resistance failure is generally indicated by reference numeral 100. The system 100 may be utilized in an electrified vehicle (not shown) and may include a battery energy control module (BECM) 102. The BECM 102 may have a ground 104. A high voltage (HV) battery pack 105 may electrically interface with the BECM 102. A main positive contactor 106, a precharge contactor 108 and a main negative contactor 110 may electrically interface with the BECM 102 and the HV battery pack 105. In some electrified vehicles, there may be additional contactors, such as plug-in charge contactors (negative, positive), direct DC charge contactors (positive, negative) and inter-pack contactors. The methodology and control strategy proposed in the present disclosure may also be applicable to those additional contactors. A main positive contactor driver 107 may interface with the main positive contactor 106. A precharge contactor driver 109 may interface with the precharge contactor 108. A main negative contactor driver 111 may interface with the main negative contactor 110. A load 114 may interface with the main positive contactor 106, the precharge contactor 108 and the main negative contactor 110. The load 114 may include a traction motor and additional electrical accessories (not shown) of the electrified vehicle as is known by those skilled in the art.

In the electrified vehicle, the HV battery pack 105 may be a main/auxiliary propulsion component. In general, the BECM 102 may be defined to sense, monitor and manage the HV battery pack 105. The signals from the HV battery pack 105 which the BECM 102 senses may include pack current, pack voltage, half pack voltage, positive contactor voltage and negative contactor voltage, for example and without limitation.

In FIG. 1, the positive half pack voltage HALF_PACK_V_TOP is the voltage measured between point 102a and the ground 104. The negative half pack voltage HALF_PACK_V_BOT is the voltage measured between point 102c and the ground 104. The positive contactor voltage V_CONT_POS is the voltage measured between point 102b and the ground 104. The negative contactor voltage V_CONT_NEG is the voltage measured between point 102d and the ground 104. The pack current PACK_CUR is the current flowing in and out of the HV battery pack 105 and is measured at point 102e. For purposes of description herein, PACK_CUR is positive when the HV battery pack 105 is discharging and is negative when the HV battery pack 105 is charging. The measurements of HALF_PACK_V_TOP, HALF_PACK_V_BOT, V_CONT_POS, V_CONT_NEG and PACK_CUR may be synchronized.

Assuming that the voltage sensors of the main positive contactor 106, the precharge contactor 108 and the main negative contactor 110 have good accuracy and precision, the contactor surface resistance can be easily measured if the main positive contactor 106 and the main negative contactor 110 are closed. The voltage drop across the main positive contactor 106 is $v_{contp}$=(HALF_PACK_V_TOP−V_CONT_POS), and the surface contact resistance on the main positive contactor 106 is estimated by the equation:

CONT_POS_$R$=(HALF_PACK_$V$_TOP−$V$_CONT_POS)/PACK_CUR

Similarly, the voltage drop across the main negative contactor 110 is $v_{contn}$=HALF_PACK_V_BOT−V_CONT_NEG, and the surface contact resistance on the main negative contactor 110 is estimated by the equation:

CONT_NEG_$R$=($V$_CONT_NEG−HALF_PACK_$V$_BOT)/PACK_CUR

If we assume that the PACK_CUR is positive when the HV battery pack 105 is charging and PACK_CUR is negative when the HV battery pack 105 is discharging, a minus (−) sign is necessary on the right side of above two equations.

If the voltage sensor of the main positive contactor 106 and the voltage sensor of the main negative contactor 110 are not sufficiently accurate, some more robust algorithms can be used to estimate contactor surface resistance. For example and without limitation, the Total Least Squares method can be used to estimate the contactor surface resistance.

For example and without limitation, if some error is considered in the measurements on HALF_PACK_V_TOP and V_CONT_POS, the voltage over the main positive contactor 106 may follow the model:

$v_{contp}(k)$=PACK_CUR($k$)×CONT_POS_$R$+OFFSET,

There may be some measurement errors on the voltage over the positive contactor $v_{contp}$ and PACK_CUR. This is a typical errors-in-variable regression problem, and a Total Least Squares algorithm or other standard regression technique can be used to estimate CONT_POS_R.

Figure 2:
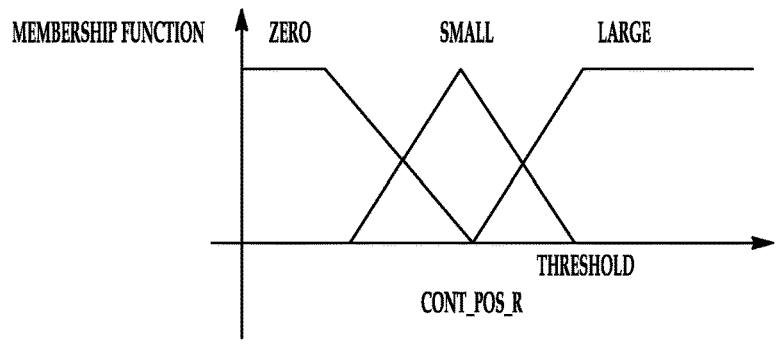
FIG. 2 is a graph which illustrates a fuzzy expert system used to determine Pow_Scale as a function of CONT_POS_R in a reduction of charge and discharge power limits to decrease heat dissipation in the event that the contactor surface resistance is increasing in implementation of an illustrative embodiment of a diagnostic method for contact resistance failure.
Figure 3:
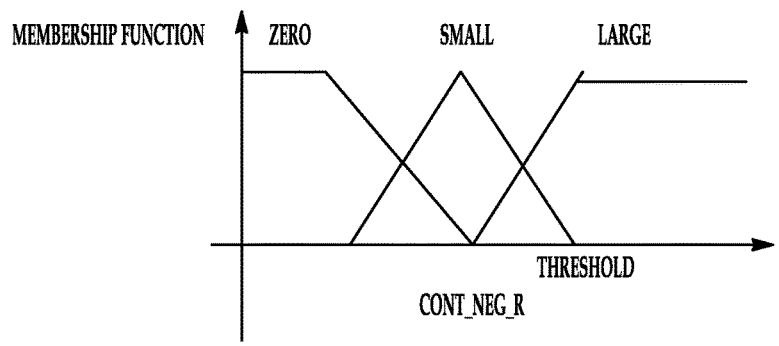
FIG. 3 is a graph which illustrates a fuzzy expert system used to determine Pow_Scale as a function of CONT_NEG_R in a reduction of charge and discharge power limits to decrease heat dissipation in the event that the contactor surface resistance is increasing in implementation of an illustrative embodiment of a diagnostic method for contact resistance failure.

A method to determine Pow_Scale can be through, for example, a fuzzy expert system as shown in FIGS. 2 and 3. Other methods such as look-up table are included in the present disclosure. If the contactor surface resistance of the contactor is increasing, then the charge and discharge power limits may be reduced by Pow_Scale to decrease the heat dissipation at the main positive contactor 106 and the main negative contactor 110. The Pow_Scale is a function of CONT_POS_R and CONT_NEG_R.

The RULE BASE of a fuzzy expert system is calibratable. Below is an example of such a rule base:

IF CONT_POS_R is ZERO AND CONT_NEG_R is ZERO THEN Pow_Scale$_1$=1.

IF CONT_POS_R is ZERO AND CONT_NEG_R is SMALL THEN Pow_Scale$_2$=0.9.

IF CONT_POS_R is ZERO AND CONT_NEG_R is LARGE THEN Pow_Scale$_3$=0.7.

IF CONT_POS_R is SMALL AND CONT_NEG_R is ZERO THEN Pow_Scale$_4$=0.9.

IF CONT_POS_R is SMALL AND CONT_NEG_R is SMALL THEN Pow_Scale$_5$=0.7.

IF CONT_POS_R is SMALL AND CONT_NEG_R is LARGE THEN Pow_Scale$_6$=0.5.

IF CONT_POS_R is LARGE AND CONT_NEG_R is ZERO THEN Pow_Scale$_7$=0.7.

IF CONT_POS_R is LARGE AND CONT_NEG_R is SMALL THEN Pow_Scale$_8$=0.5.

IF CONT_POS_R is LARGE AND CONT_NEG_R is LARGE THEN Pow_Scale$_9$=0.3.

The final Pow_Scale may be calculated using the following:

$$\text{Pow\_Scale} = \frac{\sum_{k=1}^{9} \text{Pow\_Scale}_k \times MF_{1,k}(\text{CONT\_POS\_R})_k \times MF_{2,k}(\text{CONT\_NEG\_R})_k}{\sum_{k=1}^{9} MF_{1,k}(\text{CONT\_POS\_R})_k \times MF_{2,k}(\text{CONT\_NEG\_R})_k}$$

$MF_{1,k}$ is the membership function for CONT_POS_R (FIG. 2) and $MF_{2,k}$ is the membership function for CONT_NEG_R (FIG. 3). The fuzzy system (membership functions and rule base) can be tuned through testing.

If CONT_POS_R>THRESHOLD, a conclusion that the main positive contactor 106 is faulted due to high contact surface resistance can be drawn. If CONT_NEG_R>THRESHOLD, a conclusion that main negative contactor 110 is faulted due to high contact surface resistance can be drawn. Here, THRESHOLD is a calibratable value which can be obtained by some offline testings.

The electrified vehicle may respond to the above two faults by turning on an appropriate warning lamp, thus serving as a reminder to replace the degraded contactor. Additionally or alternatively, a vehicle operator may be notified of an emissions fault via a message center or text message email, for example and without limitation. In any event, a Diagnostic Trouble Code (DTC) may be set.

In some embodiments of the diagnostic system 100, there may be a fuse between point 102a and point 102b. Inclusion of the fuse may not affect the control strategy because 1) the resistance of a fuse is usually very small and 2) usually the resistance of a fuse can be known from its manufacturer and compensated out in the estimation of CONT_POS_R and CONT_NEG_R.

It is not difficult to distinguish when contactors have stuck open faults and when contactors have damaged surfaces (i.e. large contactor resistance):

1) When a contactor is stuck open, no current will flow (the measured current may be non-zero, depending on the accuracy of the current measurement) and the voltage drop across the contactor may be a constant value;

2) When a contactor is not stuck open, but the surface is damaged and contactor resistance significantly increases, after both the main positive contactor 106 and the main negative contactor 110 are closed, the voltage drop across the surface damaged contactor will change dynamically with battery current. The larger the battery current in magnitude, the larger the voltage drop across the damaged contactor.

Figure 4:
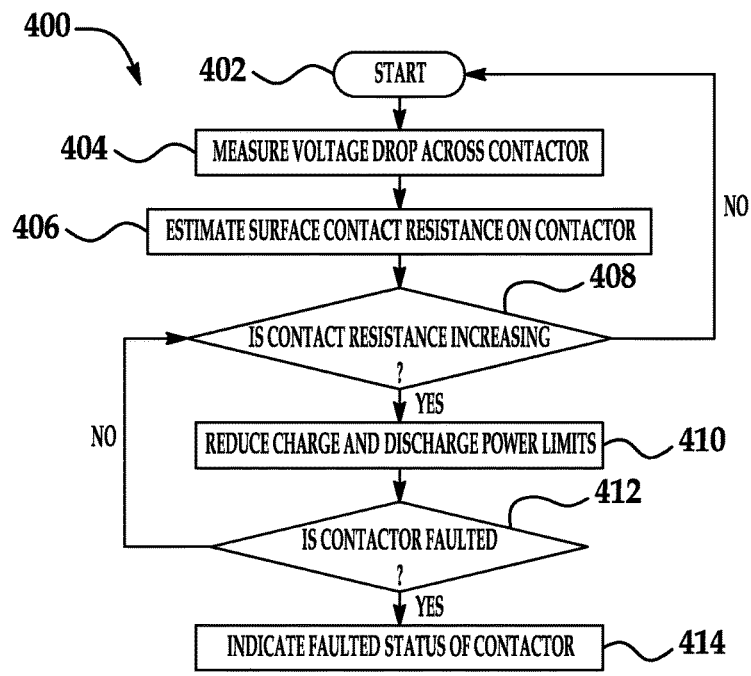
FIG. 4 is a flow diagram of an illustrative embodiment of a diagnostic method for contact resistance failure.

Referring next to FIG. 4, a flow diagram 400 of an illustrative embodiment of the diagnostic system for contact resistance failure is shown. The method begins at block 402. At block 404, a voltage drop across a contactor may be measured. At block 406, the surface contact resistance on the contactor may be estimated using the voltage drop. In some embodiments, the surface contact resistance of the contactor may be estimated by dividing the voltage drop by the battery pack current. In other embodiments, if the voltage and/or current measurements are not sufficiently accurate, the contactor surface resistance may be estimated using a robust algorithm such as the Total Least Squares method, for example and without limitation. At block 408, a determination may be made as to whether the surface contact resistance of the contactor has increased. If the surface contact resistance has not increased, the method may return to block 402.

If the surface contact resistance of the contactor has increased, at block 408, both charging and discharging power limits of the battery pack may be reduced at block 410 to decrease the heat dissipation at the contactor. The power limits may require reduction for two reasons. If there is sufficient contact resistance to cause an issue, the added resistance may cause the system voltage to reach its maximum/minimum at a lower power level. At block 412, a determination may be made as to whether the contactor is faulted due to surface contact resistance. The determination as to whether the contactor is faulted may be made by comparing the surface contact resistance of the contactor to a predetermined contact resistance threshold value. If the contactor is faulted, then at block 414, the faulted status of the contactor may be indicated. Indication of the faulted status of the contactor may be indicated by illuminating a lamp, for example and without limitation. If the contactor is not faulted at block 412, then the method may return to block 408.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A controller-implemented diagnostic method, for determining and indicating a contactor fault in an electric vehicle, a controller system causing steps comprising:
providing a high voltage battery pack interfacing with at least one contactor;
providing a controller interfacing with the high voltage battery pack and the at least one contactor;
determining the electrical contact surface resistance of at the least one contactor in communication with the high voltage battery pack, the electrical contact surface resistance determined at a selected battery current from at least one voltage drop measurement across the at least one contactor, the at least one voltage drop measurement made when the at least one contactor is in electrical communication with the high voltage battery pack and an electrical load, the at least one contactor comprising an open and closed position with respect to electrical communication with the high voltage battery pack;
decreasing the heat dissipation due to electrical contact surface resistance by controlling charge or discharge power limits at the at least one contactor if the electrical contact surface resistance of the at least one contactor has increased relative to a previous determined electrical contact surface resistance value; and,
indicating a faulted status if an estimated electrical contact surface resistance of the at least one contactor is above a predetermined value.

2. The method of claim 1 wherein estimating electrical contact surface resistance of at least one contactor comprises measuring more than one voltage drop measurements across the at least one contactor.

3. The method of claim 1 further comprising determining a pack current of the high voltage battery pack interfacing with the at least one contactor, and wherein estimating an electrical contact surface resistance of the at least one contactor further comprises dividing the voltage drop by the pack current.

4. The method of claim 1 wherein estimating the electrical contact surface resistance of the at least one contactor comprises estimating the electrical contact surface resistance using a standard regression technique.

5. The method of claim 1 further comprising determining a faulted status of the at least one contactor by comparing the electrical contact surface resistance of the at least one contactor to a predetermined contact resistance threshold value.

6. The method of claim 1 wherein decreasing the heat dissipation at the at least one contactor comprises reducing charging and discharging power limits of a high voltage battery pack interfacing with the at least one contactor.

7. A controller-implemented diagnostic method for determining and indicating contact resistance failure, a controller system causing steps comprising:
providing a high voltage battery pack interfacing with a main positive contactor and a main negative contactor;
providing a battery energy electric control module interfacing with the high voltage battery pack and the main positive and main negative contactors;
estimating electrical contact surface resistance of the main positive contactor and the main negative contactor, the electrical contact surface resistance estimated at a selected battery current from at least one voltage drop measurement across each of the main positive and main negative contactors, the at least one voltage drop measurement made when at least one of the main positive and main negative contactors is in electrical communication with the high voltage battery pack and an electrical load, each of the main positive and main negative contactors comprising an open and closed position with respect to electrical communication with the high voltage battery pack;
decreasing the heat dissipation due to electrical contact surface resistance by controlling charge or discharge power limits of at least one of the main positive contactor and the main negative contactor if the respective estimated electrical contact surface resistance has increased relative to a previously determined respective electrical contact surface resistance; and,
determining a faulted status of at least one of the main positive contactor and the main negative contactor; and
indicating the faulted status of at least one of the main positive contactor and the main negative contactor if the at least one of the main positive contactor and the main negative contactor is in the faulted status.

8. The method of claim 7 further comprising determining a pack current of the high voltage battery pack, and wherein estimating electrical contact surface resistance of the main positive contactor and the main negative contactor further comprises dividing the voltage drop by the pack current.

9. The method of claim 7 wherein estimating electrical contact surface resistance of the main positive contactor and the main negative contactor comprises estimating electrical contact surface resistance using a standard regression technique.

10. The method of claim 7 wherein determining a faulted status of at least one of the main positive contactor and the main negative contactor comprises comparing the electrical contact surface resistance of the at least one of the main positive contactor and the main negative contactor to a predetermined contact resistance threshold value.

11. The method of claim 7 further comprising determining whether the electrical contact surface resistance of the main positive contactor and the main negative contactor is increasing.

12. The method of claim 11 further comprising decreasing the heat dissipation at the main positive contactor and the main negative contactor if the electrical contact surface resistance of the main positive contactor and the main negative contactor has increased.

13. The method of claim 7 wherein decreasing the heat dissipation at the main positive contactor and the main negative contactor comprises reducing charge and discharge power limits of a high voltage battery pack interfacing with the main positive contactor and the main negative contactor.

14. A controller-implemented diagnostic method for contact determining and indicating resistance failure, a controller system causing steps comprising:
estimating electrical contact surface resistance of a main positive contactor and a main negative contactor interfacing with a high voltage battery pack and a controller, the electrical contact surface resistance estimated at a selected battery current from at least one voltage drop measurement across each of the main positive and negative contactors, the at least one voltage drop measurement made when at least one of the main positive and main negative contactors is in electrical communication with the high voltage battery pack and an electrical load, each of the main positive and main negative contactors comprising an open and closed position with respect to electrical communication with the high voltage battery pack;
decreasing the heat dissipation due to electrical contact surface resistance by controlling charge or discharge power limits of at least one of the main positive contactor and the main negative contactor if the respective estimated electrical contact surface resistance has increased relative to a previously determined respective electrical contact surface resistance; and,
determining a faulted status of at least one of the main positive contactor and the main negative contactor; and
if the at least one of the main positive contactor and the main negative contactor is in the faulted status, indicating the faulted status of at least one of the main positive contactor and the main negative contactor by illuminating a lamp.

15. The method of claim 14 wherein estimating electrical contact surface resistance of the main positive contactor and the main negative contactor comprises estimating electrical contact surface resistance comprises measuring at least one voltage drop across at least one of the main positive contactor and the main negative contactor using a standard regression technique.

16. The method of claim 14 wherein determining a faulted status of at least one of the main positive contactor and the main negative contactor comprises comparing the electrical contact surface resistance of the at least one of the main positive contactor and the main negative contactor to a predetermined contact resistance threshold value.

* * * * *